United States Patent
Mio et al.

(10) Patent No.: US 7,339,186 B2
(45) Date of Patent: Mar. 4, 2008

(54) IC CHIP WITH NANOWIRES

(75) Inventors: Hannes Mio, Taufkirchen (DE); Franz Kreupl, Munich (DE)

(73) Assignee: Infineon Technologies AG (DE)

( * ) Notice: Subject to any disclaimer, the term of this patent is extended or adjusted under 35 U.S.C. 154(b) by 133 days.

(21) Appl. No.: 10/902,486

(22) Filed: Jul. 29, 2004

(65) Prior Publication Data
US 2005/0029654 A1    Feb. 10, 2005

(30) Foreign Application Priority Data
Aug. 5, 2003    (DE)    ................. 103 35 813

(51) Int. Cl.
*H01L 29/06*    (2006.01)
*H01L 29/861*    (2006.01)

(52) U.S. Cl. ......... 257/14; 257/E27.051; 257/E27.073; 257/E29.02; 257/E29.024; 257/E29.07; 257/E29.327; 257/910; 257/922

(58) Field of Classification Search ............ 257/14
See application file for complete search history.

(56) References Cited

U.S. PATENT DOCUMENTS

| 6,097,627 A * | 8/2000 | Peterson et al. ............. 365/175 |
| 6,614,080 B2 * | 9/2003 | Vajana et al. ................ 257/390 |
| 6,806,141 B2 * | 10/2004 | Kamins ...................... 438/270 |
| 6,882,051 B2 * | 4/2005 | Majumdar et al. ........... 257/746 |
| 2002/0001905 A1 | 1/2002 | Choi et al. |
| 2002/0175408 A1 | 11/2002 | Majumdar et al. |
| 2003/0089899 A1 | 5/2003 | Lieber et al. |
| 2003/0122133 A1 | 7/2003 | Choi et al. |

FOREIGN PATENT DOCUMENTS

| DE | 197 13 173 C2 | 12/1998 |
| EP | 1 193 758 A1 | 4/2002 |
| WO | WO-01/57917 A2 | 8/2001 |
| WO | WO-03/063208 A2 | 7/2003 |

OTHER PUBLICATIONS

Cui, Yi., et al.: "High Performance Silicon Nanowire Field Effect Transistors"; Nano Letters, received Nov. 1, 2002; DOI: 10.1021/nl0258751.
Cui, Yi., et al.: "Diameter-controlled synthesis of single-crystal silicon nanowires"; Applied Physics Letters, vol. 78, No. 15, Apr. 9, 2001, pp. 2214-2216.

\* cited by examiner

*Primary Examiner*—Jerome Jackson
(74) *Attorney, Agent, or Firm*—Dickstein, Shapiro. LLP.

(57) ABSTRACT

Arrangement of nanowires with PN junctions between bit lines and word lines are arranged as a ROM memory cell array. A number of the nanowires have dielectric regions and are present only as a dummy. The connections between word and bit lines may also exist as transistors which turn on or turn off only when a gate voltage is applied. A number of these transistors are constructed in complementary fashion and/or have insulating regions built in and serve as a dummy.

9 Claims, 2 Drawing Sheets

IC CHIP WITH NANOWIRES

CROSS-REFERENCE TO RELATED APPLICATION

This application claim priority to German Patent Application Serial No. 10335813.7, filed Aug. 5, 2003, which is incorporated herein by reference in its entirety.

FIELD OF THE INVENTION

The present invention relates to an IC chip having an electronic circuit formed with nanowires, some of which are provided as dummies.

BACKGROUND OF THE INVENTION

It has been shown in recent years that semiconducting thin conductor filaments, so-called nanowires, made of a material from a multiplicity of material classes, such as e.g. Si, Ge, GaAs, GaN, CdS, CdTe, ZnO, etc., can be grown by solid-state reactions. By way of example, with the aid of silicide-forming metals with silicon-containing gases, it is possible to grow thin silicon nanowires having diameters of approximately 1 nm to 400 nm at temperatures of typically 400° C. These silicon nanowires may be doped in n-conducting fashion and p-conducting fashion and may also be modulation-doped. Moreover, they may be oxidized in sections. Owing to the possibility of forming PN junctions in a nanowire, it is thus possible to produce diodes or transistors which may be arranged in particular vertically with respect to the circuit planes of an IC chip. The nanowires may also be used as a vertical electrically conductive connection between wiring planes. Oxidized regions within the nanowire may be provided as an interruption. The production of such nanowires is described e.g. in US 2003/0089899 A1 and in the publication by Y. Cui et al. in Applied Physics Letters 78, 2214-2216 (2001).

Thin contact holes having a typical diameter of the nanowires to be produced of 1 nm to 400 nm are produced in a dielectric layer, in particular an intermetal dielectric between wiring planes of a chip, (e.g. made of silicon dioxide. Gold is deposited onto the bottom of the contact holes with a thickness of approximately 0.2 nm to 20 nm. Optionally, it is also possible to deposit gold clusters of suitable size (e.g. Au-30 cluster to Au-3000 cluster) at the bottom of the holes. Under a suitable silicon-containing atmosphere e.g. with silane, silicon is introduced into the gold. The silicon is separated from the gold and grown in the form of a thin silicon filament within the contact hole, the deposited gold being raised and as it were floating on the surface of the nanowire. In this way, the entire contact hole can be filled with a thin silicon filament. The gold is subsequently situated as small particles on the top side.

By addition of dopant atoms, the nanowires may be doped in n-conducting fashion or p-conducting fashion in its entirety or only in sections. It may also be interrupted by a dielectric region by adding e.g. oxygen or nitrogen in order to form a region of $SiO_2$ or $Si_3N_4$ in the nanowire. A transistor structure may be produced by depositing an electrically conductive material as a thin layer on a portion of the dielectric layer provided for the nanowires. The remainder of the dielectric layer provided for the nanowires is applied thereto. After contact hole etching, an electrically conductive material that can be used as the gate electrode of a transistor is therefore situated halfway up the contact hole. For this purpose, the material has to be provided with a thin dielectric layer toward the inside of the contact hole. This may be done e.g. by oxidation of the relevant material. The nanowire is doped with different signs of the electrical conductivity, so that a channel region doped oppositely to a lower and upper source/drain region is present at the level of the gate electrode.

In the case of 3D ROMs vertical connections between two wiring planes of the chip are used for coding a memory content. If the vertical connections are formed as diodes, in which case nanowires, in particular, may be used, and the terminals of said diodes are connected at the top and bottom in each case to a bit line and word line from a columnwise arrangement of bit lines and a rowwise arrangement of word lines, ROMs can be produced in a simple manner and with minimization of the necessary area requirement.

SUMMARY OF THE INVENTION

It is an object of the present invention to specify an IC chip having an electronic circuit, in particular a memory chip, in which a reverse engineering for covertly observing the memory content is made substantially more difficult.

This object is achieved by means of the IC chip having the features of claim 1. Refinements emerge from the dependent claims.

In the case of the IC chip, nanowires are used as vertical conductors, vertical diodes or vertical transistors, an envisaged number of which are formed without a circuit function as a respective dummy. The nanowires may, in particular as diodes or transistors, form the memory cells of a ROM whose content is concealed by the presence of a number of functionless nanowires. The formation of nanowires as a dummy may be effected in particular by the nanowire not being doped or by a doping indeed being present but being unsuitable for a component that exercises a function in the electronic circuit. Moreover, electrically insulating regions may be formed in the nanowires by, e.g. in an exemplary embodiment with nanowires made of silicon, silicon dioxide or silicon nitride having been grown, instead of the silicon, within a specific region of the nanowire.

Said IC chip may be in particular a ROM whose memory cells are in each case diodes formed by a nanowire. A number of nanowires are provided as a dummy in order thus to conceal the actual memory content. The nanowires are in each connected between bit lines and word lines which are in each case arranged parallel at a distance with respect to one another and form a matrix-type grid. The bit lines may be formed in particular in semiconductor material or within an oxide layer as polysilicon strips. The word lines are formed by interconnects, in particular metallic interconnects, running transversely with respect thereto on the top side. In principle, the memory cells may be arranged in each circuit plane of the IC chip. The memory cells may thus be present in particular in the plane of an intermetal electric of the wiring planes. The bit lines and word lines may then be formed by interconnects of two successive wiring planes. Instead of this, it is also possible to arrange the ROM on the top side of the wirings.

In order to conceal the memory content, nanowires with an apparent diode structure may nevertheless be present as dummies at each memory location or at least in an envisaged number of memory locations which are not programmed with a diode. By way of example, a dielectric region is formed there as an interruption in the nanowire that is otherwise doped like a diode, or the polarity of the PN junction is reversed. Heterojunctions may also be present between portions of different compositions of the semiconductor material. A modulation doping makes it possible to form, along the nanowires, variable dopings and different dopant profiles insofar as the sign of the conductivity type and the dopant concentrations and thus the conductivity of the semiconductor material are concerned. Owing to the small dimensions of the nanowires, such differences or intentionally defective structures can be ascertained only with very great difficulty in the course of reverse engineering.

The nanowires may, in particular in a memory chip, also be formed as transistors which form the memory cells of a ROM whose content is concealed by the presence of a number of functionless transistors. The nanowires provided as dummies may be different from the nanowires that actually function as transistors for example by virtue of a different dopant profile. The dummies may have in particular a section which is made electrically insulating or at least poorly conducting by the absence of the doping or by oxidation of the semiconductor material. A different doping of the transistors and of the dummies may also be performed such that, with a gate voltage applied, one portion of the transistors is conductive (normally on) and another portion is nonconductive (normally off). Such a distinction may be provided in order to additionally make it more difficult to identify the function of the transistors within the memory cell array or in the associated drive circuit.

Furthermore, the gate electrodes of all or at least a portion of the transistors realized in nanowires may be provided with electrical terminals from above, that is to say from that side of the nanowires which is remote from the substrate. If reverse engineering is employed in an attempt to decipher the chip construction and the ROM content, then the upper layers generally have to be removed for this purpose. However, this interrupts the upper leads to the relevant gate electrodes, so that these gate electrodes are only at floating potential. Consequently, the function of the associated transistors can be discovered only with very great difficulty.

BRIEF DESCRIPTION OF THE DRAWINGS

Examples of the IC chip are described in more detail below with reference to FIGS. 1 to 4.

DETAILED DESCRIPTION OF THE PREFERRED MODE OF THE INVENTION

Figure 1:
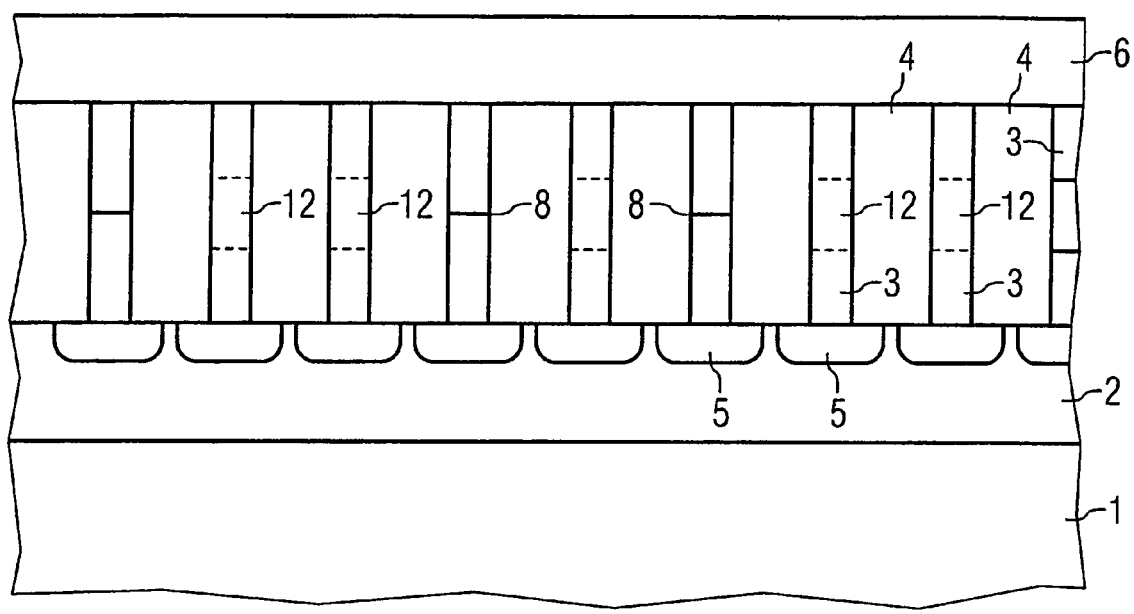
FIG. 1 shows a cross section through a ROM with memory cells formed by nanowires.

FIG. 1 shows a cross section through a chip in which a layer 2 made of dielectric material is applied on a substrate 1. By way of example, polysilicon strips 5 are arranged as bit lines in said layer 2. The bit lines run parallel to one another perpendicular to the plane of the drawing and in each case form a lower terminal of the nanowires 3, which are arranged in a dielectric layer 4, e.g. made of silicon dioxide. Word lines 6 which run parallel to one another transversely with respect to the bit lines 5 are situated on the top side. The programming of the memory cells formed by the nanowires 3 is performed by virtue of PN junctions 8 being present in a portion of the nanowires, so that these nanowires function as diodes which in each case bridge a bit line 5 and a word line 6. The nonprogrammed memory cells contain nanowires with interruptions by a dielectric region 12 which is e.g. silicon dioxide or silicon nitride.

Figure 2:
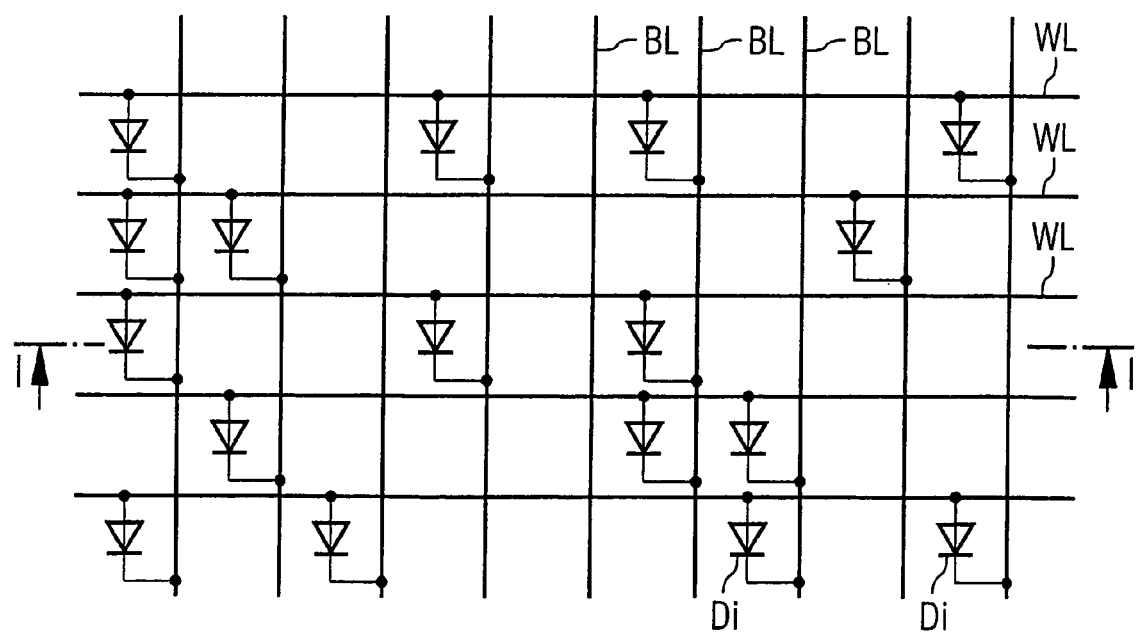
FIG. 2 shows a circuit scheme for a ROM in accordance with FIG. 1.

FIG. 2 illustrates a detail from a circuit scheme of such a ROM. The word lines WL in this case run rowwise, and the bit lines BL columnwise. A programmed portion of the memory cells contain a respective diode Di, which in this case is respectively biased such that the PN current direction runs from a word line WL to a bit line BL. The scheme of the nanowires for the memory cell row highlighted in FIG. 2 is illustrated as an example in FIG. 1. What are present there from left to right are a diode, two dummy memory cells, a diode, a dummy memory cell, a diode and a sequence of dummy memory cells. The same scheme is reproduced in FIG. 1 in the sequence of the PN junctions 8 and the dielectric regions 12—forming interruptions—of the nanowires. In accordance with the example of FIG. 2, therefore, in FIG. 1 in each case an upper portion of the nanowires 3 is doped in p-conducting fashion and a lower portion is doped in n-conducting fashion.

Figure 3:
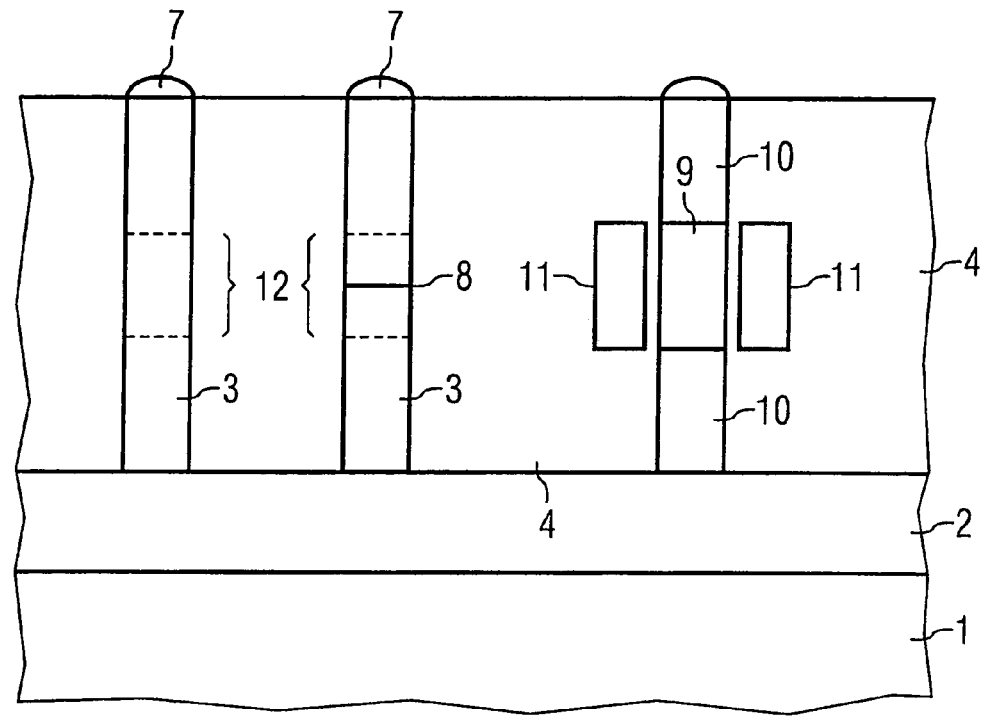
FIG. 3 shows a cross section of an exemplary embodiment of the IC chip with differently configured nanowires.

FIG. 3 shows a cross section through an IC chip with different configurations of the nanowires 3. Situated on the substrate 1 is a layer 2, which may be e.g. a multilayered layer comprising wiring planes and intermetal dielectrics. However, the layer 2 may also be a portion of such a layer structure which comprises e.g. only the lower metal strata of the wiring. Instead of this, the layer 2 may also be a passivation of the semiconductor material, e.g. a BPSE layer or the like. The arrangement of the vertical connections formed by the nanowires 3 may therefore be chosen, in principle, in any desired layer stratum above the substrate 1.

The nanowires are produced by contact holes being etched out down to the layer 2 in a dielectric layer 4, e.g. made of silicon dioxide. This is done using a suitably patterned mask. A thin gold layer is applied on the bottom of the contact holes and takes up the silicon from the silicon atmosphere and deposits it in the structure of the nanowires onto the base. Instead of being produced from silicon, the nanowires may also be produced from a different semiconductor material, e.g. from germanium or a different one of the materials enumerated in the introduction. In this way, the nanowires 3 are grown until the gold particles 7 have finally reached the top side of the dielectric layer 4.

The material of the nanowires may be provided with dopant atoms. If the production process is interrupted in the meantime and the added dopant atoms are exchanged into dopant atoms for the electrical conductivity of the opposite conductivity type, it is possible to produce the PN junctions 8 in the nanowires as indicated in FIG. 3. Instead of this, it is also possible for the dopant atoms provided for an electrical conduction to be replaced by oxygen or nitrogen, so that the dielectric regions 12 are formed as electrically insulating interruptions e.g. approximately halfway up the nanowires 3. Silicon dioxide or silicon nitride is situated there, in embodiments in which the nanowires are formed from silicon or from germanium and proportionately from germanium-silicon in the sections provided for the dielectric regions, said silicon dioxide or silicon nitride being continued above once again by portions of the silicon nanowires or germanium nanowires.

At the finished IC chip, it is difficult to discern which of the nanowires 3 are formed with interruptions of this type. Therefore, e.g. at the central nanowire 3 illustrated in FIG. 3, it is difficult to discern whether a PN junction 8 is actually present or whether this nanowire has a dielectric region 12 as an interruption. Therefore, an examination of the structure of the nanowires, which are extremely thin, for the purpose of covertly observing the circuit is made extremely more difficult.

An example of a transistor formed with the nanowire is illustrated on the right-hand side in FIG. 3, in the case of which transistor a central region 9 provided for a channel region is arranged between oppositely doped source/drain regions 10. The central region 9 is doped e.g. in p-conducting fashion, while the source/drain regions 10 are doped in n-conducting fashion. In order to produce the gate electrodes 11, the dielectric layer 4 is firstly grown only proportionately, and there then follows the electrically conductive layer provided for the material of the gate electrodes 11, and finally once again the dielectric material up to the full height of the dielectric layer 4. The layer provided for the gate electrodes is either provided with cutouts, or inner portions of the gate electrodes 11 are electrically insulated after the etching-out of the contact holes, e.g. by means of an oxidation. The gate dielectric is formed in this way.

The fact of whether the central region 9 is e.g. undoped (intrinsically conducting) or doped in p-conducting fashion as a channel region or is formed in electrically insulating fashion e.g. from silicon dioxide or silicon nitride can be ascertained externally only with very great difficulty. Therefore, it is practically not possible to discern which of the transistors that are apparently present are actually functional and provided for the circuit.

Figure 4:
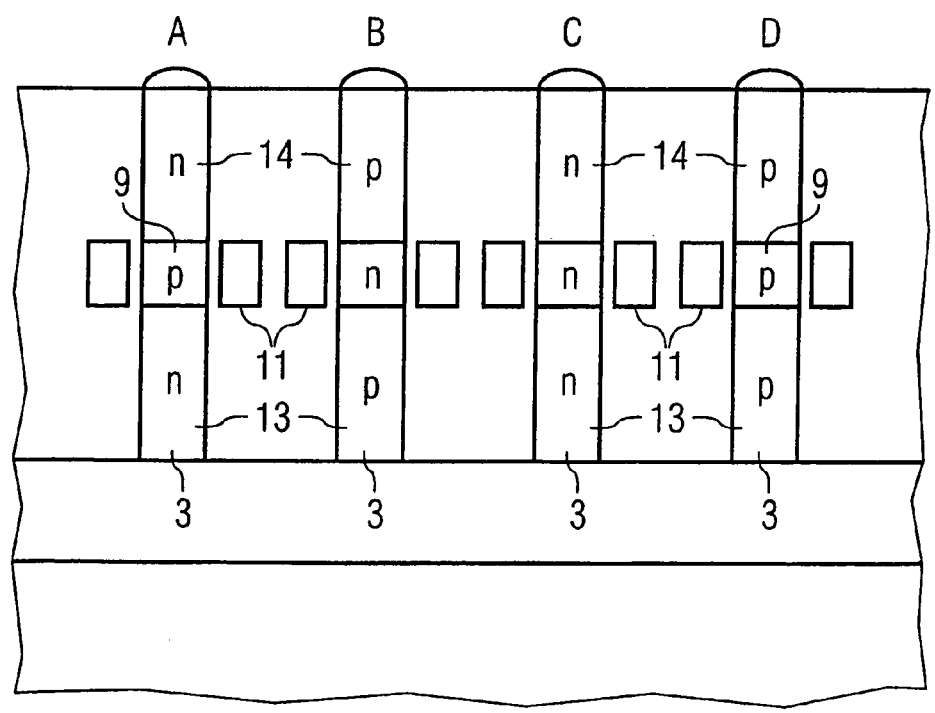
FIG. 4 shows a cross section of a further exemplary embodiment of the IC chip with nanowires configured differently as transistors.

FIG. 4 illustrates a further exemplary embodiment of the IC chip in cross section, in which transistors or transistor dummies are in each case formed in the nanowires. A lower section 13 of a nanowire is in each case doped for the same sign of the electrical conductivity as an upper section 14. That is respectively n conduction in the case of the nanowires 3 designated by A and C, and respectively p conduction in the case of the nanowires 3 designated by B and D. Depending on the envisaged function of the transistor, the central region 9 is doped oppositely to the upper and lower sections, as in the case of the nanowires A and B, or doped identically as in the case of the nanowires C and D. Instead of this, dielectric regions may be formed in the central region 9, as already described with reference to FIG. 3. The nanowires A, B, C and D are examples which, depending on the function of the circuit and depending on the dopant concentrations, function as transistors (which are generally formed as normally off in the examples of A and B) or as dummies. In a ROM, at least the lower section 13 or the upper section 14 is connected to a bit line and the gate electrode 11 is connected to a word line.

The invention claimed is:

1. An IC chip comprising an electronic circuit formed with a plurality of nanowires as vertical conductors, vertical diodes or vertical transistors, arranged in a dielectric layer wherein at least one of said nanowires is provided as a dummy, wherein the dummy is unsuitable as a vertical conductor, vertical diode or vertical transistor:
   wherein at least one dummy is formed by a relevant nanowire being interrupted by a dielectric region formed in the nanowire between first and second doped region; and
   the nanowires are silicon and the dielectric region is silicon dioxide or silicon nitride.

2. An IC chip comprising:
   at least one nanowire FET, said FET having source and drain electrodes without a dielectric region in an area between the source and drain; and
   at least one nanowire FET structure having a dielectric region between a source region and a drain region.

3. An IC chip comprising
   at least one nanowire structure having a first doped region and a second doped region without a dielectric region in an area between the first doped region and the second doped region; and
   at least one nanowire structure having a first doped region and a second doped region with a dielectric region in an area between the first doped region and the second doped region.

4. An IC chip as claimed in claim 3, wherein;
   the first doped regions are doped in n-conducting fashion;
   the second doped regions are doped in p-conducting fashion; and
   the at least one nanowire structure without a dielectric region in an area between the first doped region and the second doped region forms a diode.

5. An IC chip as claimed in claim 3, wherein:
   the first doped regions and the second doped regions are doped for the same sign of electric conductivity; and
   the at least one nanowire structure without a dielectric region in an area between the first doped region and the second doped region forms a transistor.

6. An IC chip as claimed in one of claims 3 to 5, wherein the dielectric region is formed by an absence of the doping.

7. An IC chip as claimed in one of claims 3 to 5, wherein the dielectric region is formed by an oxide of a semiconductor material.

8. An IC chip as claimed in one of claims 3 to 5, wherein the dielectric region is formed by a nitride of a semiconductor material.

9. An IC chip as claimed in one of claims 3 to 5, wherein the nanowires form memory cells of a ROM.

* * * * *